United States Patent
Bittlestone et al.

(10) Patent No.: US 8,051,398 B2
(45) Date of Patent: Nov. 1, 2011

(54) TEST METHOD AND SYSTEM FOR CHARACTERIZING AND/OR REFINING AN IC DESIGN CYCLE

(75) Inventors: Clive D. Bittlestone, Allen, TX (US);
Kenneth M. Butler, Richardson, TX (US); Mark E. Mason, Allen, TX (US);
Stephanie Watts Butler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 475 days.

(21) Appl. No.: 11/967,496

(22) Filed: Dec. 31, 2007

(65) Prior Publication Data

US 2009/0037854 A1    Feb. 5, 2009

Related U.S. Application Data

(60) Provisional application No. 60/953,334, filed on Aug. 1, 2007.

(51) Int. Cl.
*G06F 17/50* (2006.01)

(52) U.S. Cl. ........ 716/111; 716/113; 716/134; 716/136; 716/139

(58) Field of Classification Search .................. 716/4–6, 716/113, 134, 139, 111, 136
See application file for complete search history.

(56) References Cited

U.S. PATENT DOCUMENTS

| | | | |
|---|---|---|---|
| 7,590,968 B1 * | 9/2009 | Becker et al. .................. 716/21 |
| 2005/0050497 A1 * | 3/2005 | Tetelbaum ........................ 716/6 |
| 2006/0288322 A1 * | 12/2006 | Zhang et al. ...................... 716/9 |
| 2007/0288219 A1 * | 12/2007 | Zafar et al. ...................... 703/14 |

\* cited by examiner

*Primary Examiner* — Vuthe Siek
(74) *Attorney, Agent, or Firm* — John R. Pessetto; W. James Brady; Frederick J. Telecky, Jr.

(57) ABSTRACT

Systems and methods are provided for refining a design cycle for an integrated circuit. An integrated circuit design is generated. A plurality of non-critical paths within the integrated circuit design are identified. A set of at least one of the plurality of non-critical paths is modified to produce a modified design in which the sensitivity of each of the set of non-critical paths to at least one parameter is enhanced. Each parameter is either a design parameter or a process parameter. An integrated circuit is fabricated according to the modified design. The fabricated integrated circuit is evaluated to measure a set of timing data representing each of the plurality of non-critical paths. The value of the parameter is determined from the measured set of timing data.

18 Claims, 3 Drawing Sheets ize and/or refining a design cycle of an integrated
TEST METHOD AND SYSTEM FOR CHARACTERIZING AND/OR REFINING AN IC DESIGN CYCLE

RELATED APPLICATION

This application claims the benefit of U.S. provisional patent application No. 60/953,334, which was filed on Aug. 1, 2007, and entitled SYSTEM AND METHOD FOR EXTRACTING AND TESTING SYSTEMATIC AND RANDOM VARIATION SENSITIVE AS WELL AS DEFECT-SENSITIVE AREAS OF INTEGRATED CIRCUIT DESIGNS, which is incorporated herein by reference.

TECHNICAL FIELD

The invention relates generally to integrated circuit fabrication, and more particularly to systems and methods for characterizing and/or refining a design cycle of an integrated circuit.

BACKGROUND

A typical IC design cycle involves numerous steps ranging generally from initial feasibility studies, functional verification and circuit design through fabrication, packaging and data sheet generation. It is frequently cost effective to conduct tests throughout the design cycle to ensure that the design and the resulting wafers meet certain quality parameters. Various types of testing thus are performed at different stages of the design and fabrication process. An in-line parametric test is an electrical test performed on test pattern structures located on wafers, such as arranged at specific locations on the wafer. The test structures can be utilized to assess film thickness or linewidths as well as to ascertain an indication of leakage current or breakdown voltages or other parameters of transistor devices.

Many different IC failures can also be detected by employing fault models. For example, automatic test pattern generators can be employed to generate patterns that are used to test semiconductor devices after manufacture, and in some cases to assist with determining the cause of failure. The efficacy of the test pattern can be influenced by the fault model under consideration, the type of circuit under test (full scan, synchronous sequential, or asynchronous sequential), the level of abstraction used to represent the circuit under test (gate, register-transistor, switch), and the required test quality. However, many existing testing methods tend to focus on defect-driven yield issues.

SUMMARY

In accordance with an aspect of the invention, a method is provided for refining a design cycle for an integrated circuit. An integrated circuit design is generated. A plurality of non-critical paths within the integrated circuit design are identified. A set of at least one of the plurality of non-critical paths is modified to produce a modified design in which the sensitivity of each of the set of non-critical paths to at least one parameter is enhanced. Each parameter is either a design parameter or a process parameter. An integrated circuit is fabricated according to the modified design. The fabricated integrated circuit is evaluated to measure a set of timing data representing each of the plurality of non-critical paths. The value of the parameter is determined from the measured set of timing data.

In accordance with another aspect of the invention, a process is provided for manufacturing an integrated circuit having test structures incorporated as part of functional cells in the integrated circuit. An integrated circuit design is generated. A plurality of non-critical paths are identified within the integrated circuit design. A set of at least one of the plurality of non-critical paths is selected. The set of non-critical paths is modified to produce a modified design in which the sensitivity of each of the set of non-critical paths to the parameter is enhanced. An integrated circuit is fabricated according to the modified design.

In accordance with yet another aspect of the invention a system is provided for manufacturing an integrated circuit. A first means is provided for identifying a plurality of non-critical paths within an integrated circuit design. A second means is provided for selecting a set of at least one of the plurality of non-critical paths that are sensitive to a parameter. The parameter is one of a design parameter and a fabrication process parameter. A third means is provided for fabricating the integrated circuit via a fabrication process according to the integrated circuit design. A fourth means is provided for evaluating the fabricated integrated circuit to measure a set of timing data representing each of the plurality of non-critical paths. A fifth means is provided for determining a value of the parameter from the measured set of timing data. A sixth means is provided for adjusting at least one of the integrated circuit design and the fabrication process according to the determined value for the parameter.

BRIEF DESCRIPTION OF THE DRAWINGS

The foregoing and other aspects of the invention will become apparent to those skilled in the art to which the invention relates upon reading the following description with reference to the accompanying drawings.

DETAILED DESCRIPTION

Design and process flaws present in an integrated circuit design cycle can be extremely difficult to characterize due to the sheer complexity of the design and fabrication process. A flaw or point of variation located in a completed integrated circuit product can stem from any of numerous potential variances in process and design as well as countless interactions between these variances. As a result, even when the location and general character of a flaw is known, it can be difficult to determine its exact cause. Some information can be gained through the use of dedicated test structures on a wafer, both between the various integrated circuits comprising the wafer and within the space occupied by the integrated circuits. These dedicated test structures do not form part of the functional circuitry, but instead as the name suggests are implemented solely for testing purposes. Such test structures occupy real estate that might otherwise be utilized for functional circuitry.

In accordance with an aspect of the invention, the invention can utilize functional circuitry in the integrated circuit for testing purposes. By "functional," it is meant that the circuitry is an integral part of the integrated circuit, as opposed to a structure added to the wafer for testing purposes. Portions of the functional circuitry can be evaluated to determine their sensitivity to various parameters in the design and fabrication. Elements of circuitry determined to be particularly sensitive to one or more selected parameters can be used during a testing phase in place of or in supplement to dedicated test structures on the wafer. It will be appreciated by utilizing elements of the integrated circuit itself for the testing process, space that would otherwise be occupied by the test structures and the associated control and logic circuitry for these structures can be utilized for functional portions of the integrated circuit.

Figure 1:
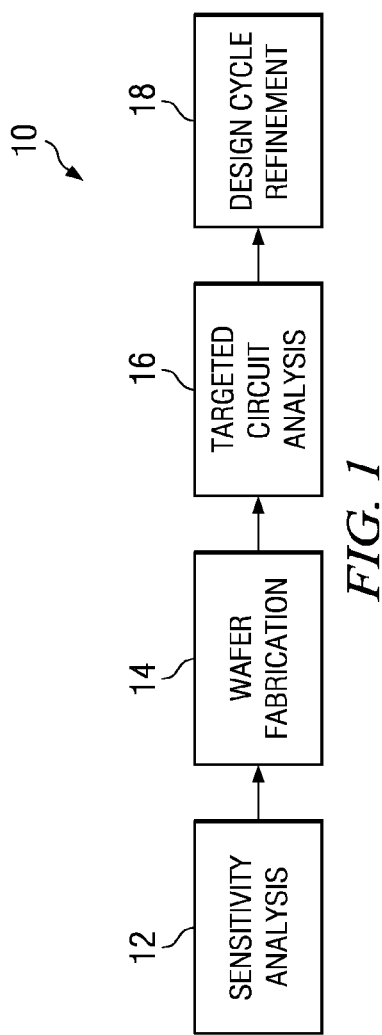
FIG. 1 illustrates a functional block diagram of a system for refining an integrated circuit design cycle in accordance with an aspect of the invention.

FIG. 1 illustrates a functional block diagram of a system 10 for refining an integrated circuit design cycle in accordance with an aspect of the invention. A sensitivity analysis component 12 evaluates a circuit design to determine the sensitivity of various elements in the circuit design to one or more design and fabrication process parameters. As an example, the sensitivity of a path to a given parameter is the amount of variance in the timing of that path (e.g., the amount of delay required) expected for a given change in the parameter. The sensitivity analysis component 12 can include any of a number of systems and software for determining the sensitivity of various portions and components of the integrated circuit to variance in design and process parameters. For example, an optical proximity correction routine can be utilized to determine regions of the integrated circuit with a propensity to have weak or potentially resistive contacts. Similarly, the design can be reviewed to determine regions having minimally spaced pairs of conductors or subjected to reticle enhancement tools to identify contacts that would be sensitive to variations in a given lithography step during wafer processing. The design can also be modeled at this point, for example, via some sort of simulation or static timing analysis, to establish expected timing data for the integrated circuit.

In one implementation, the design of the circuit can be intentionally altered to increase the sensitivity of one or more cells within the integrated circuit to a given process or design parameter. In this implementation, the circuit design can be subjected to a timing analysis routine to determine a plurality of non-critical paths for the integrated circuit. As is known to one of skill in the art, a critical path within an integrated circuit is the path between a designated input and a designated output having the maximum amount of delay relative to other paths. The other paths between the designated input and the designated output can be considered non-critical paths, which are said to have a certain amount of slack. Slack corresponds to the difference between the maximum allowable arrival time and the actual arrival time of a signal at a node (or point) of a given path. It will be appreciated that critical and non-critical paths, as used herein, refer to groupings of cells that are part of the functional design of the integrated circuit. A test structure isolated from the function portions of the integrated circuit, regardless of its location on a wafer, cannot be part of a critical or non-critical path, as the terms are used herein.

In the timing analysis, a number of non-critical paths can be identified, and a set of non-critical paths can be selected according to one or more of their location, amount of slack, and associated function within the circuit. Functional cells within these non-critical paths can be modified to increase the sensitivity of the path to a given parameter of the design and fabrication process. For example, one or more cells can be altered to make a path more sensitive to the resistance of one of the metals or metal levels used in fabrication. While this may result in additional delay in the modified circuit, it will be appreciated that the selected circuits will still have a reasonable amount of slack, allowing for an increase in the path delay without surpassing the delay of the critical path. The function of the integrated circuit is thus unaffected.

A wafer, containing the integrated circuit, is then fabricated at a wafer fabrication component 14. It will be appreciated that the wafer fabrication component 14 can comprise a number of distinct processes, including, for example, doping, etching, deposition, polishing, and imaging processes. The completed wafer is then provided to a targeted circuit analysis component 16. The targeted circuit analysis component 16 evaluates the portions of the circuit that were identified as being sensitive to one or more parameters to determine precise values for the parameters. In one implementation, delay fault testing is performed on the integrated circuit to determine respective delays associated with the sensitive circuit portions. Other types of timing analysis and verification testing can be performed relative to the fabricated wafer to ascertain analysis data indicative of the actual operation of the wafer, including for the designated sensitive circuit portions. The determined delays can be compared to expected delays to determine the variance of each parameter from an expected value.

The determined parameter values are then utilized in a design cycle refinement stage 18 to isolate one or more portions of the design or fabrication process that can be altered to eliminate or mitigate the effects of any variance in the determined parameters. For example, the determined parameters can be used to update optimal proximity correction recipes, determine appropriate changes to fabrication process parameters, or isolate one or more portions of the wafer for further testing. It will be appreciated that the illustrated system 10 can be employed iteratively using the altered design and fabrication process to further refine the design cycle.

Figure 2:
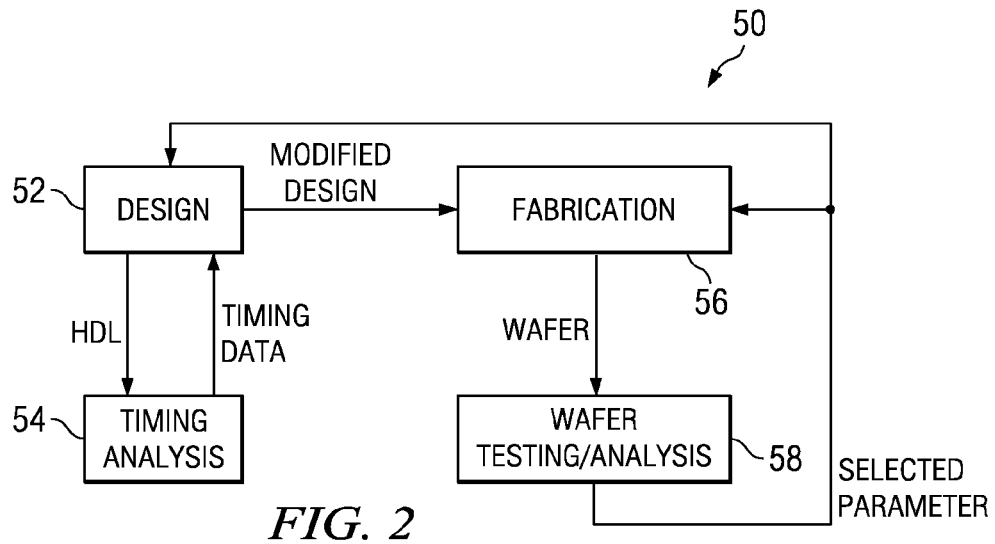
FIG. 2 illustrates an exemplary design cycle in accordance with an aspect of the invention.

FIG. 2 illustrates an exemplary IC design cycle 50 in accordance with an aspect of the invention. It will be appreciated that the illustrated design cycle 50 is greatly simplified for the purpose of example. The design cycle 50 begins at design stage 52 where an initial integrated circuit design is generated. This design stage 52 can include any of a number of processes and design tools for generating a working design for an integrated circuit, including digital design tools, such as electronics system level design tools, register transfer level design tools, and physical design tools.

The resulting design is then provided to a timing analysis component 54, for example, as hardware descriptive language (HDL), that models the timing behavior of the integrated circuit design. For example, the timing analysis component can comprise a simulation analysis or some form of static timing analysis. As a further example implementation, a statistical static timing analysis (SSTA) can be utilized. The timing analysis of the original design establishes a set of timing data for the design, including associated expected delays and ranges of delays for each of a plurality of paths within the design, such as in the form of a Gaussian distribution having a mean and standard deviation. From this analysis, critical paths within the design can be determined, and an amount of slack can be identified for the non-critical paths within the circuit.

The timing data derived from the timing analysis can be provided back to the design stage 52, where a modified design can be generated. Specifically, sets of one or more non-critical paths having sufficient slack to absorb some additional delay can be modified to become especially sensitive to one or more respective design and process parameters associated with the design cycle 50. For example, parameters such as the capacitance and resistance of various traces associated with materials used in the fabrication of the circuit, and the drive current in the n-doped and p-doped portions of the wafer. Those skilled in the art will appreciate various other parameters that can be utilized, which parameters may vary from path to path such as according to a known sensitivity a given path might have to a particular parameter. Each of the selected non-critical path can be altered to emphasize the effects of its associated parameter on the path delay, for example, by increasing the amount of a given material, altering a characteristic (e.g., resistance or conductance) of a given material that is utilized in the path, altering the length and width of traces within the path, or altering the driver side function for that portion of the circuit. The particular type of modification that is performed on a given path can be selected based on which type of modification will achieve a desired increased or enhanced sensitivity to a respective parameter that can be evaluated subsequently in the design cycle 50.

The modified design is then provided to a fabrication stage 56, where a wafer is created from the modified design. The fabricated wafer 56 is then subjected to a wafer testing and analysis phase 58. At the wafer testing and analysis phase 58, testing data for the fabricated integrated circuit, including timing data for the plurality of paths comprising the integrated circuit, can be determined. For example, the wafer testing and analysis phase 58 can include various yield enhancement techniques, such as including a variety of analysis tools available from Magma Design Automation, Inc. (e.g., Knights LogicMap™ technology) for identifying defects and potential areas of defect within the integrated circuit. It will be appreciated that this testing phase 58 can be designed to focus on the sensitized portions of the circuit as well as identified portions of the original design known to have an enhanced sensitivity to various parameters. The timing data from these sensitized paths in the design can be used to generate precise values for the parameters associated with the sensitized portions. These parameters, as well as other information derived from production-level testing, can be fed back to the fabrication stage 56 to refine one or more fabrication processes as well as the design state 52 to refine the integrated circuit design.

Figure 3:
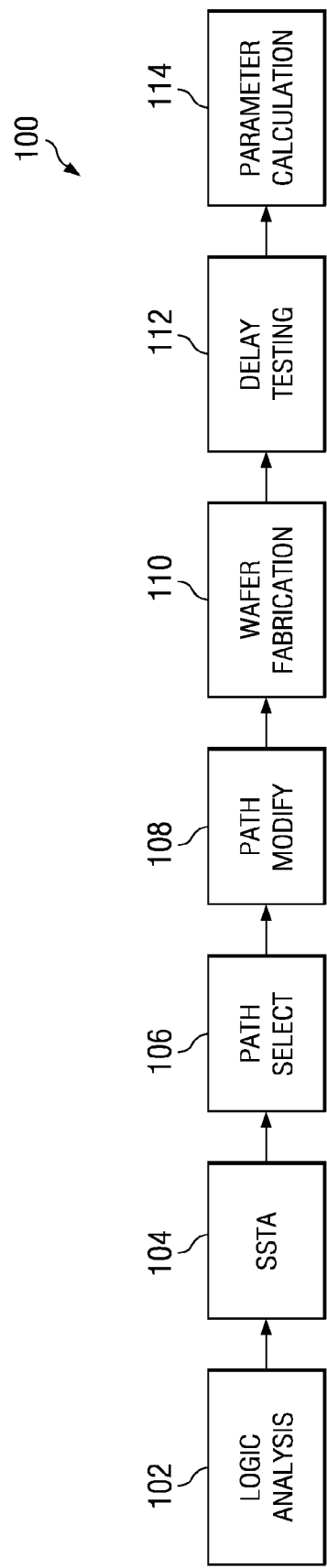
FIG. 3 illustrates an exemplary wafer production system in accordance with an aspect of the invention.

FIG. 3 illustrates an exemplary wafer production system 100 in accordance with an aspect of the invention. An integrated circuit design is provided to a logic analysis element 102 that reviews the integrated circuit design for locations of the design that will be prone to defects during the fabrication process, specifically to deviations in one or more design and process parameters. For example, the logic analysis component 102 can include an optical proximity correction routine that locates weak or resistive contacts within the circuit, a review that locates minimally spaced pairs of conductors, or various reticle enhancement routines that identify contacts that are expected to be sensitive to variations in a given lithography step during wafer processing.

The design can then be provided to a statistical static timing analysis system 104. The statistical static timing system models the timing of the design to establish an expected range of delays for each of a plurality of circuit paths comprising the integrated circuit. Accordingly, a series of critical paths within the integrated circuit are identified, along a plurality of non-critical paths associated with the critical paths. An amount of slack and skew associated with each non-critical path can also be determined at this stage.

At a path selection element 106, a set of one or more of the identified non-critical paths are selected for each of a plurality of design or process parameters of interest. For example, a first set of non-critical paths can be selected for a resistance parameter for one of the fabrication materials. Similarly, a second set of non-critical paths can be selected for a drive current parameter for the IC. Each path in a given set can be selected according to a number of characteristics. For example, paths having larger amounts of slack will generally be favored for sensitizing, as the delay caused by any modification to the path can be more easily absorbed without adversely affecting the normal operation of the circuit path. Further, the paths in each set can be selected for diversity of location within integrated circuit and diversity of functional components within the non-critical paths, such that the variance in a given parameter throughout the integrated circuit can be evaluated. For example, a plurality of non-critical paths distributed across a given IC can be selected. Additionally, for wafer-level testing, selected ICs distributed across the wafer can be selected for testing associated process parameters that might vary across a given wafer.

The selected sets of paths are then provided to a path modification component 108 where each set of the selected paths is modified within the integrated circuit design to increase their sensitivity to the parameter associated with the set. One or more logical cells within each path in a given set can be changed in design or material composition such that variance in the parameter associated with the set. For example, the amount of a given material used to fabricate a given circuit element within the path can be increased to sensitize the path to one or more properties of that material. Other changes, for example, weakening or strengthening a drive current associated with a given circuit path. Still other modifications can result from modifying one or more process parameters associated with the deposition of materials, etching chemistry and the like.

A wafer containing at least one instantiation (usually a plurality) of an integrated circuit represented by the modified design is produced at a wafer fabrication component 110. The wafer fabrication component 110 can comprise a number of distinct processes, including, for example, doping, etching, deposition, polishing, and imaging processes, and each of these processes can have one or more associated process parameters that can be represented by the selected sets of non-critical paths. The fabricated wafer is then provided to a testing component 112 that determines an actual delay for each of the plurality of paths comprising the circuit. For instance, the testing component 112 can implement delay fault testing to provide the timing data, such as including slack and skew values for the plurality of paths.

The measured delay values can be provided to a parameter calculation component 114, where the deviation of the measured delay values in each path from the expected delay values for that path can be determined. From the determined deviation along each path in a set of non-critical paths associated with a given parameter, a deviation in that parameter from expected values can be determined. The deviations in the process and design parameters can be fed back to the design and fabrication process portions of the wafer production system 100, such that one or both of the design and the fabrication process can be modified to mitigate the determined deviations.

Figure 4:
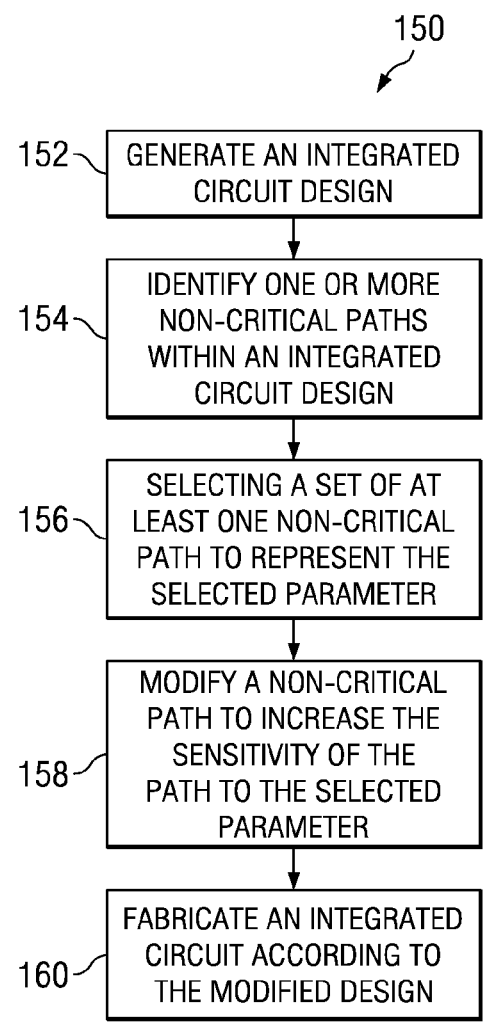
FIG. 4 illustrates a methodology for manufacturing an integrated circuit having test structures incorporated as part of functional cells in the integrated circuit.
Figure 5:
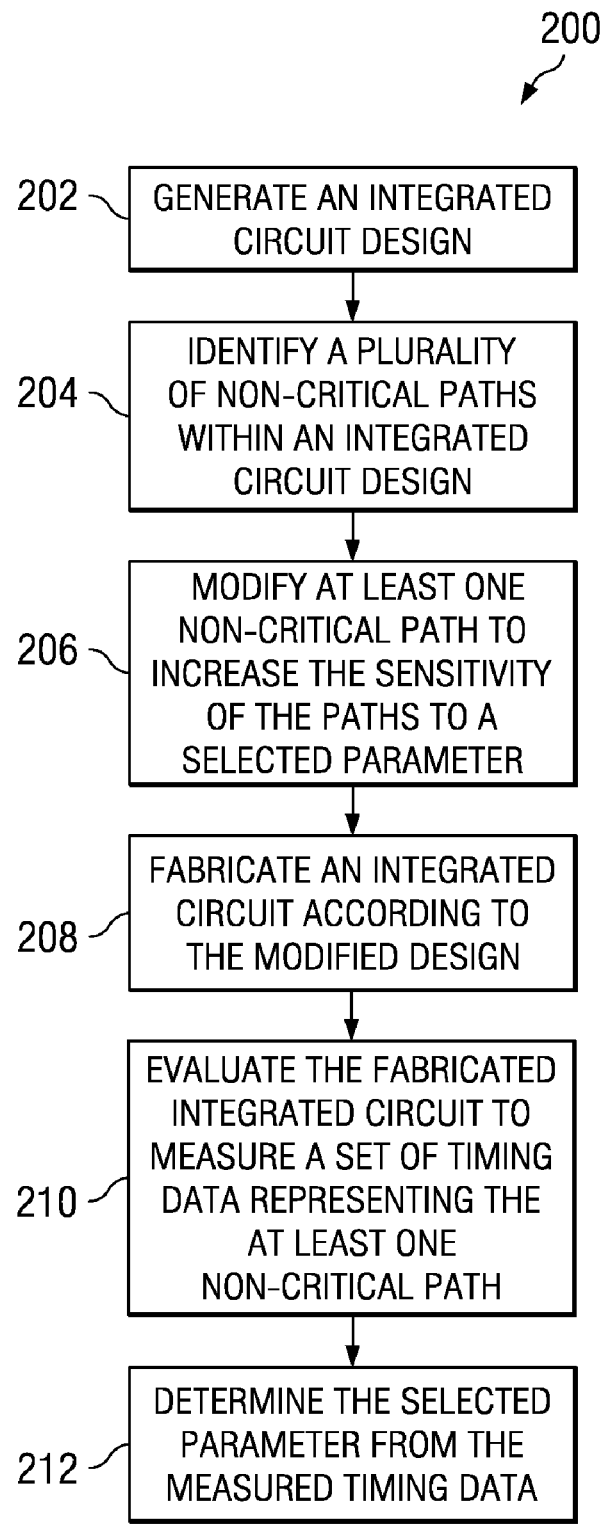
FIG. 5 illustrates a methodology for refining a design cycle for an integrated circuit.

In view of the foregoing structural and functional features described above, a methodology in accordance with various aspects of the invention will be better appreciated with reference to FIGS. 4 and 5. While, for purposes of simplicity of explanation, the methodologies of FIGS. 4 and 5 are shown and described as executing serially, it is to be understood and appreciated that the invention is not limited by the illustrated order, as some aspects could, in accordance with the invention, occur in different orders and/or concurrently with other aspects from that shown and described herein. Moreover, not all illustrated features may be required to implement a methodology in accordance with an aspect the invention.

FIG. 4 illustrates a methodology 150 for manufacturing an integrated circuit having test structures incorporated as part of functional cells in the integrated circuit. At 152, an integrated circuit design is generated. At 154, a plurality of non-critical paths are identified within the integrated circuit design. For example, the integrated circuit design can be modeled via a timing analysis, such as statistical static timing analysis, to determine expected delays for each path within the circuit. The paths can be grouped according to their initiation points and destinations, with the path having the largest associated delay between a given initiation point and destination being a critical path, and other paths between that initiation point and destination being non-critical paths. Each non-critical path has a degree of slack, that is, excess time due to its lesser delay relative to the critical path.

At 156, a set of at least one of the plurality of non-critical paths is selected to represent a design or fabrication process parameter. Each path in the set of non-critical paths can be selected, for example, according to one or more of the function of one or more logical cells in the path, the location of the path within the integrated circuit design, and the amount of slack associated with the path. The set of at least one of the plurality of non-critical paths is modified at 158 to produce a modified design in which the sensitivity of each of the non-critical paths in the set to a selected parameter is enhanced. For example, the material composition of a trace or one or logical cells within the path can be altered or specific logic cells within the path can be substituted for different cells with comparable functions. At 160, the integrated circuit is fabricated according to the modified design.

FIG. 5 illustrates a methodology 200 for refining a design cycle for an integrated circuit. At 202, an integrated circuit design is generated. At 204, a plurality of non-critical paths are identified within the integrated circuit design. For example, the integrated circuit design can be modeled via a timing analysis to determine expected delays for each path within the circuit. The paths can be grouped according to their initiation points and destinations, with the path having the largest associated delay between a given initiation point and destination being a critical path, and all other paths between that initiation point and destination being non-critical paths. Each non-critical path has an amount of slack relative to the critical path. The paths exhibiting a greatest amount of slack can be identified as the set of non-critical paths.

The set of at least one of the plurality of non-critical paths is modified at 206 to produce a modified design in which the sensitivity of each of the non-critical paths in the set to a selected parameter is enhanced. For example, a material composition of a trace or one or logical cells within the path can be altered or specific logic cells within the path can be substituted for different cells with comparable functions, but having a known sensitivity to the selected parameter. At 208, the integrated circuit is fabricated according to the modified design. At 210, the fabricated integrated circuit is evaluated to measure a set of timing data representing each of the plurality of non-critical paths. For example, a delay fault testing process can be used to determine an actual delay value for each of the plurality of non-critical paths. At 212, a value is determined for the selected parameter from the measured set of timing data. For example, a set of actual delay values can be compared to a set of expected delay values to determine a change in the delay caused by variance in the selected parameter, and the parameter itself can be determined from the determined change in the delay.

What has been described above includes exemplary implementations of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within and scope of this document, including the appended claims.

What is claimed is:

1. A method for refining a design cycle for an integrated circuit comprising:
    generating an integrated circuit design;
    identifying a plurality of non-critical paths within the integrated circuit design;
    modifying a set of at least one of the plurality of non-critical paths to produce a modified design in which a sensitivity of each non-critical path in the set of at least one of the plurality of non-critical paths to at least one parameter is enhanced, wherein the at least one parameter is selected from a group consisting of a design parameter and a process parameter;
    fabricating the integrated circuit according to the modified design;
    evaluating the fabricated integrated circuit to produce a measured set of timing data representing timing characteristic for each path in the set of at least one of the plurality of non-critical paths; and
    determining a value of the at least one parameter from the measured set of timing data.

2. The method of claim 1, further comprising selecting the set of at least one of the plurality of non-critical paths according to at least one of an associated slack of each non-critical path, a location of each non-critical path within the integrated circuit design, and an associated function of each non-critical path.

3. The method of claim 1 wherein modifying the set of at least one of the plurality of non-critical paths further comprises modifying a first set of at least one non-critical path to enhance the sensitivity of each path in the first set of at least one non-critical path to the process parameter and modifying a second set of at least one non-critical path to enhance the sensitivity of each path in the second set of at least one non-critical path to the design parameter.

4. The method of claim 1, wherein identifying the plurality of non-critical paths comprises modeling the generated integrated circuit design to determine expected timing data for each of the plurality of non-critical paths.

5. The method of claim 4, wherein modeling the generated integrated circuit design comprises conducting a timing analysis of the generated integrated circuit design.

6. The method of claim 1, wherein evaluating the fabricated integrated circuit comprises conducting delay fault testing on the fabricated integrated circuit to determine an actual delay for each of the plurality of non-critical paths in the set of at least one of the plurality of non-critical paths.

7. The method of claim 1, wherein modifying the set of at least one of the plurality of non-critical paths comprises altering a material composition of at least one logical cell within each of the at least one non-critical path.

8. The method of claim 1 for refining a design cycle for an integrated circuit wherein the process parameter comprises a group consisting of doping, etching, deposition, polishing and imaging.

9. The method of claim 1 for refining a design cycle for an integrated circuit wherein the design parameter comprises a group consisting of capacitance, resistance and drive current.

10. A process for manufacturing an integrated circuit having test structures incorporated as part of functional cells in the integrated circuit comprising:
generating an integrated circuit design;
identifying a plurality of non-critical paths within the integrated circuit design;
selecting a set of at least one of the plurality of non-critical paths;
modifying the set of at least one of the plurality of non-critical paths to produce a modified design in which a sensitivity of the set of at least one of the plurality of non-critical paths to a parameter is enhanced, wherein the parameter is selected from a group consisting of a design parameter and a process parameter; and
fabricating the integrated circuit according to the modified design.

11. The process of claim 10, wherein selecting the set of at least one of the plurality of non-critical paths comprises selecting the set of at least one of the plurality of non-critical paths according to an amount of slack associated with each non-critical path.

12. The process of claim 10, wherein selecting the set of at least one of the plurality of non-critical paths comprises selecting the set of at least one of the plurality of non-critical paths according to a location of each non-critical paths within the integrated circuit design as to maximize a diversity of the location of the paths across the integrated circuit design.

13. The process of claim 10, wherein identifying the plurality of non-critical paths comprises modeling the generated integrated circuit design via a statistical static timing analysis to determine expected timing data for each of the plurality of non-critical paths.

14. The process of claim 10, wherein modifying the set of at least one of the plurality of non-critical paths comprises altering a material composition of at least one logical cell within each of the at least one non-critical path.

15. The process of claim 10, further comprising:
analyzing each of path in the set of at least one of the plurality of non-critical paths in the fabricated integrated circuit to provide a set of analysis data; and
determining a value of the parameter for each path in the set of at least one of the plurality of non-critical paths from the set of analysis data.

16. A system for manufacturing an integrated circuit comprising:
means for identifying a plurality of non-critical paths within an integrated circuit design;
means for selecting a set of at least one of the plurality of non-critical paths that are sensitive to a parameter, the parameter being one of a design parameter and a process parameter;
means for fabricating the integrated circuit via a fabrication process according to the integrated circuit design;
means for evaluating the fabricated integrated circuit to produce a measured a set of timing data representing each of the paths in the set of at least one of the plurality of non-critical paths;
means for determining a value of the parameter from the measured set of timing data; and
means for adjusting at least one of the integrated circuit design and the fabrication process according to the determined value for the parameter.

17. The system of claim 16, wherein the means for evaluating the fabricated integrated circuit further comprises means for conducting delay fault testing on the fabricated integrated circuit to determine an actual delay for each of the plurality of non-critical paths.

18. The system of claim 16, wherein the means for identifying the plurality of non-critical paths further comprises means for modeling the generated integrated circuit design to determine expected timing data for each of the plurality of non-critical paths, and the means for determining the value of the parameter comprising means for comparing the expected timing data to the measured timing data.

* * * * *